(12) United States Patent
Zang et al.

(10) Patent No.: US 10,263,122 B1
(45) Date of Patent: Apr. 16, 2019

(54) METHODS, APPARATUS, AND MANUFACTURING SYSTEM FOR SELF-ALIGNED PATTERNING OF CONTACTS IN A VERTICAL FIELD EFFECT TRANSISTOR

(71) Applicant: GLOBALFOUNDRIES INC., Grand Cayman (KY)

(72) Inventors: Hui Zang, Guilderland, NY (US); Ruilong Xie, Niskayuna, NY (US); Tek Po Rinus Lee, Ballston Spa, NY (US); Lars Liebmann, Mechanicville, NY (US)

(73) Assignee: GLOBALFOUNDRIES INC., Grand Caymay (KY)

( * ) Notice: Subject to any disclaimer, the term of this patent is extended or adjusted under 35 U.S.C. 154(b) by 0 days.

(21) Appl. No.: 15/828,386

(22) Filed: Nov. 30, 2017

(51) Int. Cl.
| | |
|---|---|
| *H01L 29/786* | (2006.01) |
| *H01L 29/66* | (2006.01) |
| *H01L 21/336* | (2006.01) |
| *H01L 21/8238* | (2006.01) |
| *H01L 29/808* | (2006.01) |
| *H01L 29/788* | (2006.01) |
| *H01L 27/088* | (2006.01) |
| *H01L 21/302* | (2006.01) |
| *H01L 27/092* | (2006.01) |
| *H01L 21/8234* | (2006.01) |
| *H01L 29/78* | (2006.01) |
| *H01L 21/3065* | (2006.01) |

(52) U.S. Cl.
CPC ........ *H01L 29/8083* (2013.01); *H01L 21/302* (2013.01); *H01L 21/3065* (2013.01); *H01L 21/8234* (2013.01); *H01L 21/8238* (2013.01); *H01L 27/088* (2013.01); *H01L 27/092* (2013.01); *H01L 29/78* (2013.01); *H01L 29/786* (2013.01); *H01L 29/7889* (2013.01)

(58) Field of Classification Search
CPC . H01L 29/8083; H01L 29/7889; H01L 29/78; H01L 29/786; H01L 27/088; H01L 27/082; H01L 21/302; H01L 21/3065; H01L 21/8234; H01L 21/8238
USPC ............ 257/263, 329, 77, E21.409, E21.41, 257/E21.447, E21.629, E27.06, E29.255, 257/E29.262, E29.313; 438/268, 38, 192, 438/705
See application file for complete search history.

(56) References Cited

U.S. PATENT DOCUMENTS

| | | | |
|---|---|---|---|
| 8,080,458 B2 * | 12/2011 | Masuoka | .......... H01L 29/42356 257/E21.41 |
| 9,443,982 B1 * | 9/2016 | Balakrishnan | .... H01L 29/66742 |
| 9,870,952 B1 * | 1/2018 | Cheng | ............ H01L 21/823487 |
| 9,953,973 B1 * | 4/2018 | Balakrishnan | .... H01L 29/66136 |

(Continued)

*Primary Examiner* — Dao H Nguyen
(74) *Attorney, Agent, or Firm* — Williams Morgan, P.C.

(57) ABSTRACT

A method, apparatus, and manufacturing system are disclosed herein for a vertical field effect transistor including a gate contact patterned in a self-aligned process. In one embodiment, we disclose a semiconductor device, including a semiconductor substrate and a first vertical field effect transistor (vFET) including a bottom source/drain (S/D) region disposed on the semiconductor substrate; a fin disposed above the bottom S/D region; a top source/drain (S/D) region disposed above the fin and having a top surface; and a gate having a top surface higher than the top surface of the top S/D region. A gate contact may be formed over the gate.

10 Claims, 13 Drawing Sheets

(56) References Cited

U.S. PATENT DOCUMENTS

2009/0200604 A1\* 8/2009 Chidambarrao .. H01L 29/66787
　　　　　　　　　　　　　　　　　　　　257/329
2018/0069131 A1\* 3/2018 Balakrishnan .... H01L 29/78642
2018/0233503 A1\* 8/2018 Balakrishnan ...... H01L 29/7788

\* cited by examiner

METHODS, APPARATUS, AND MANUFACTURING SYSTEM FOR SELF-ALIGNED PATTERNING OF CONTACTS IN A VERTICAL FIELD EFFECT TRANSISTOR

BACKGROUND OF THE INVENTION

Field of the Invention

Generally, the present disclosure relates to the manufacture of sophisticated semiconductor devices, and, more specifically, to various methods for forming contacts in a vertical FET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than a threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

In contrast to a planar FET, which has a flat structure, there are so-called 3D devices, which may be termed fin-FETs. More specifically, in such 3D devices, a generally vertically positioned, fin-shaped active area is formed and a gate electrode encloses both of the sides and the upper surface of the fin-shaped active area to produce a channel having a 3-dimensional structure instead of a planar structure. In some cases, an insulating cap layer, e.g., silicon nitride is positioned at the top of the fin-shaped active areas.

FinFET designs form "fins" on the surface of a semiconductor wafer using selective-etching processes. The fins may be used to form a raised channel between the source and drain of a transistor. The gate is then deposited such that it wraps around the fin. This 3-dimensional channel is relatively thin, and thus, the gate generally has significant control over the carriers within. However, the shape of the channel may limit the current flow. Therefore, multiple fins may be used in parallel to provide greater current flow for increased drive strength.

To satisfy the ever-increasing desire for a smaller footprint for semiconductor devices, designers have turned to vertical FETs (vFETs). A vFET generally has a channel that is in a perpendicular configuration relative to the substrate surface. This is in contrast to conventional FETs that have channels that are configured along the plane of the substrate surface. The vertical configuration of vFETs allows for increased packing density since vFETs provide improved scaling limits as compared to conventional FETs.

The increased packing density possible with vFETs, however, raises attendant challenges. Forming contacts to the gate, source, and drain of each of a plurality of densely packed vFETs using conventional patterning techniques requires very precise alignment of the contacts to the gates, sources, and drains, which may result in misalignment errors. Also, given that contact formation generally involves forming openings in various layers, which generally become narrower with increasing depth in order to make an opening with a bottom dimension of desirably large width or length, the top dimension must generally be of even larger width or length. However, forming openings with large widths or lengths may result in misalignment of contacts and/or undesirable electrical coupling between contacts that have large openings. Misalignment of contacts, or dense packing of contacts with relatively large top dimensions, may lead to undesirable electrical coupling between a contact and another contact or a vFET structure. Such electrical coupling may lead to short circuits, reducing the usefulness of the vFET. This problem may be especially pronounced at fin pitches (distances between neighboring vFET fins) of 36 nm or less.

SUMMARY OF THE INVENTION

It would be desirable to form a contact to at least the gate of a vFET in a process with a reduced risk of misalignment.

The following presents a brief summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and manufacturing systems for fabricating a vertical field effect transistor (vFET) device. In one embodiment, the present disclosure provides a method, including: depositing a mask over a semiconductor device including a semiconductor substrate; a first vertical field effect transistor (vFET) including a bottom source/drain (S/D) region disposed on the semiconductor substrate; a fin disposed above the bottom S/D region; a top source/drain (S/D) region disposed above the fin and having a top surface; and a gate including a first portion laterally surrounding the fin and a second portion having a top surface higher than the top surface of the top S/D region; wherein the mask is deposited over the second portion of the gate; forming a gate contact opening in the mask, wherein the gate contact opening is formed over the second portion of the gate and is not formed over the top S/D region and the bottom S/D region; and filling the gate contact opening with a gate contact material.

In one embodiment, the present disclosure provides a semiconductor device, including: a semiconductor substrate, and a first vertical field effect transistor (vFET), including: a bottom source/drain (S/D) region disposed on the semiconductor substrate; a fin disposed above the bottom S/D region; a top source/drain (S/D) region disposed above the fin and having a top surface; and a gate including a first portion laterally surrounding the fin and a second portion having a top surface higher than the top surface of the top S/D region.

In one embodiment, the present disclosure provides a semiconductor device manufacturing system adapted to perform a method, such as is summarized above.

BRIEF DESCRIPTION OF THE DRAWINGS

The disclosure may be understood by reference to the following description taken in conjunction with the accompanying drawings, in which like reference numerals identify like elements, and in which.

Figure 1:
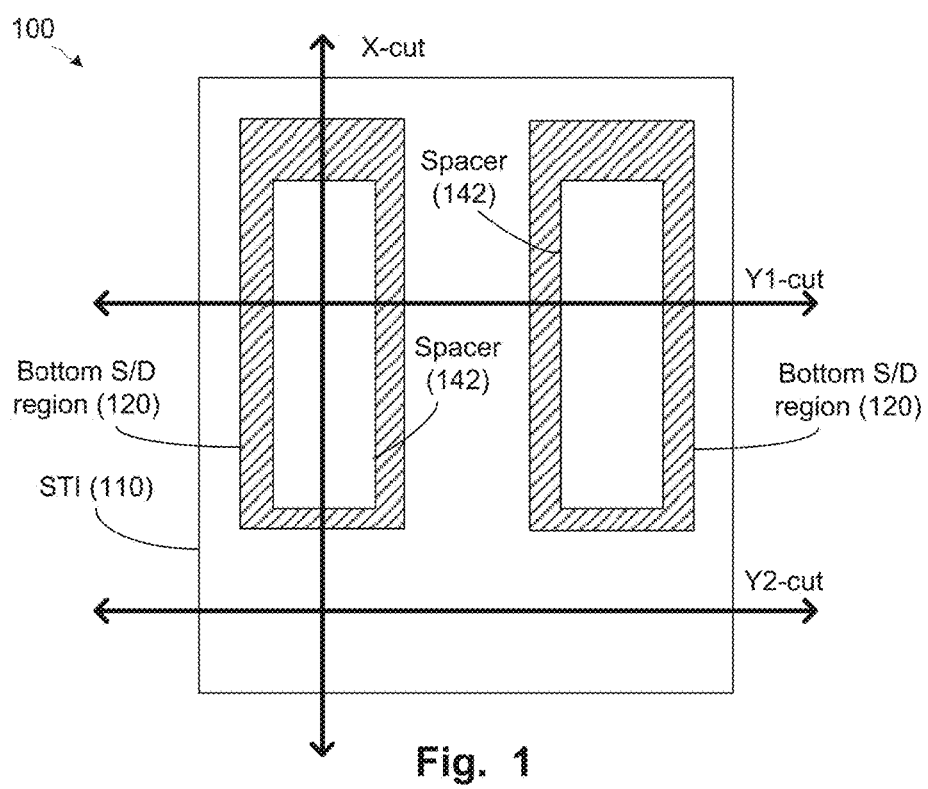
FIG. 1 illustrates a stylized plan depiction of a vFET device, showing an X cut, a Y1 cut, and a Y2 cut, from each of which one or more cross-sectional depictions in subsequent figures may be shown.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming vertical field effect transistor (vFET) devices with self-aligned contacts such as, for example, gate contacts. In one embodiment, a fin pitch between neighboring vFET devices may be 36 nm or less.

FIG. 1 illustrates a stylized plan depiction of a vFET device 100 in accordance with embodiments herein. The vFET device 100 may also be referred to herein as semiconductor device 100. The vFET includes a plurality of fins, a top source/drain (S/D) region on each fin, and a spacer 142 on and around each top S/D region. Accordingly, only the spacer 142 is visible in FIG. 1. For ease of illustration, only two spacers 142 are shown in FIG. 1; however, those skilled in the art would appreciate that the vFET device 100 may include additional fins and, accordingly, additional spacers 142. Each fin is disposed on a bottom source/drain (S/D) region 120. The bottom S/D regions 120 are separated from one another by a shallow trench isolation (STI) 110 region. Generally, each bottom S/D region 120 is disposed in a semiconductor substrate (not visible in FIG. 1 under STI region 110 and bottom S/D region 120). Generally, in a final device, at least one side of each fin will generally be in contact with a gate (not shown in FIG. 1).

Subsequent stylized cross-sectional depictions of the vFET device 100 according to embodiments herein will be taken along one of three cuts, an X-cut (through and parallel to the long axis of two fins 130), a Y1-cut (through and perpendicular to the long axis of the two fins 130), and a Y2-cut (perpendicular to the long axis of the fins 130 and through STI region 110).

Figure 2:
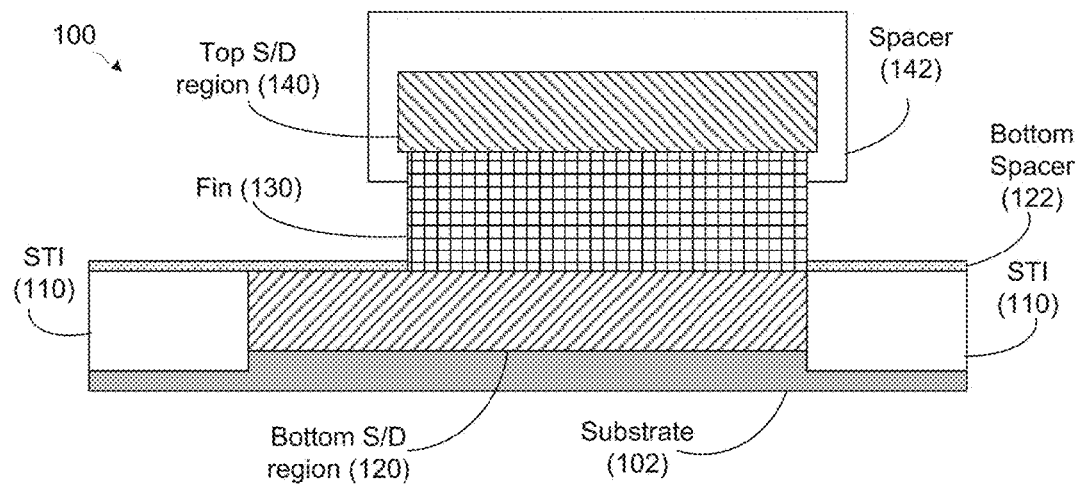
FIG. 2 illustrates a stylized X-cut cross-sectional depiction of the vFET device under manufacture with respect to a state prior to performing various processes, in accordance with embodiments herein.
Figure 3:
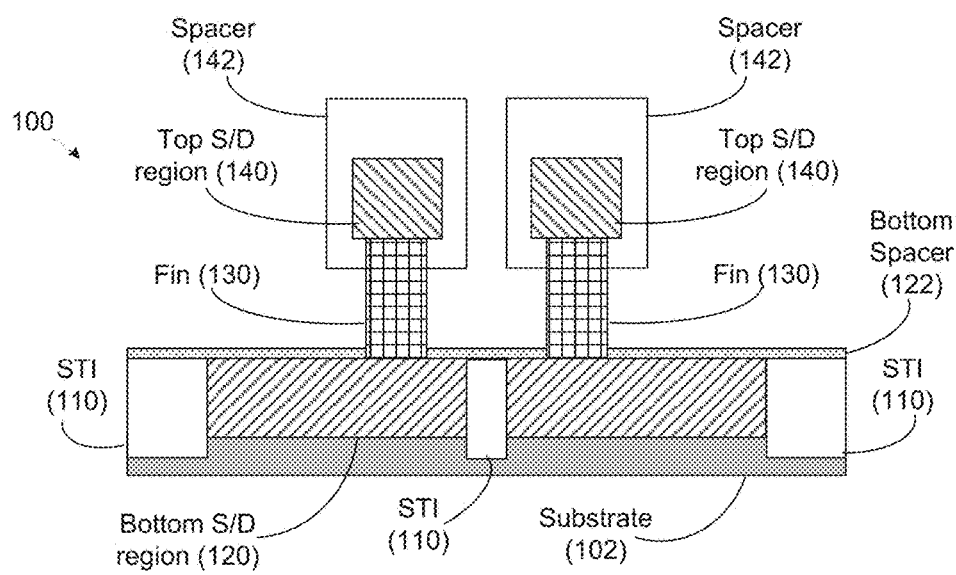
FIG. 3 illustrates a stylized Y1-cut cross-sectional depiction of the vFET device under manufacture with respect to a state prior to performing various processes, in accordance with embodiments herein.

FIGS. 2-20 illustrate stylized cross-sectional depictions of a vFET device 100 under various stage of manufacture, in accordance with embodiments herein. FIG. 2 illustrates a stylized X-cut cross-sectional depiction of the vFET device 100 shown in plan view in FIG. 1, under manufacture with respect to a state prior to performing various processes described below, in accordance with embodiments herein. FIG. 3 illustrates a stylized Y1-cut cross-sectional depiction of the vFET device 100 under manufacture in the same state.

In some embodiments, processing steps may be performed to provide a vFET device 100. The vFET device 100 includes a substrate 102 (e.g., silicon substrate, silicon germanium substrate, etc.). Using one of various techniques known to those skilled in the art, a plurality of fins 130 are formed above the substrate 102. The fins 130 may be formed from the same material as the substrate or from one or more different materials. Each fin 130 is disposed on a bottom S/D region 120. Bottom S/D region 120 is formed on the substrate 102. STI regions 110 are also formed on the substrate 102. A top S/D region 140 is formed on the fin 130 and includes a top surface. A bottom spacer 102 is formed on the STI region 110 and a top surface of the portion of the bottom S/D region 120 that is not covered by fin 130. A spacer 142 is formed that surrounds, and is over top of, the S/D region 140. In one embodiment, the spacer 142 may include silicon nitride. In the depicted embodiment, all surfaces of the top S/D region 140 are covered either by the fin 130, or by the spacer 142. Further, in many embodiments, various features of the vFET device 100, such as those depicted in FIGS. 2-3 and others which will be apparent to a person of ordinary skill in the art having the benefit of the present disclosure, may be formed using techniques known to a person of ordinary skill in the art having benefit of the present disclosure, and need not be described further.

Figure 4:
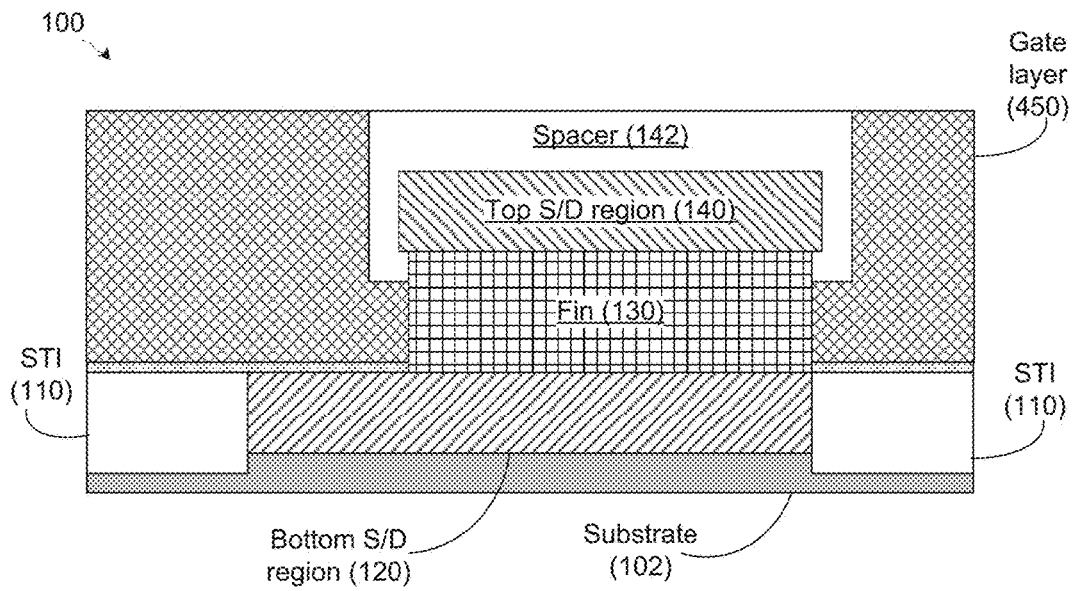
FIG. 4 illustrates a stylized X-cut cross-sectional depiction of the vFET device under manufacture with respect to gate formation and chemical mechanical polishing (CMP) processes, in accordance with embodiments herein.
Figure 5:
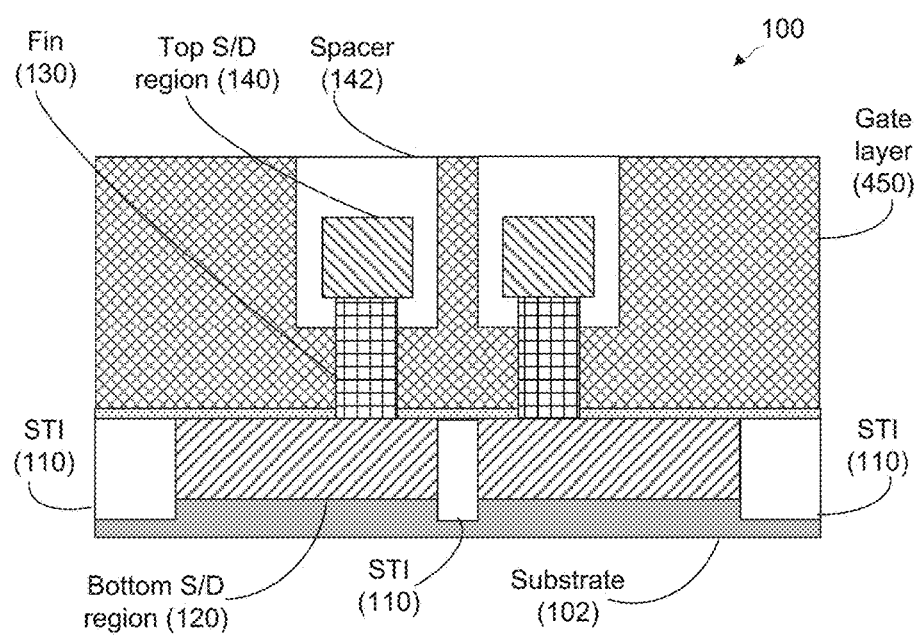
FIG. 5 illustrates a stylized Y1-cut cross-sectional depiction of the vFET device under manufacture with respect to gate formation and chemical mechanical polishing (CMP) processes, in accordance with embodiments herein.
Figure 6:
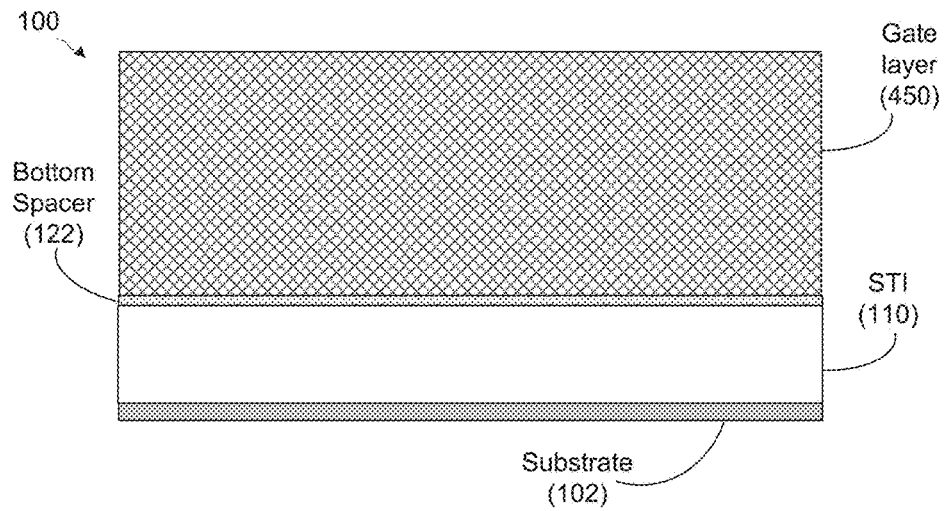
FIG. 6 illustrates a stylized Y2-cut cross-sectional depiction of the vFET device under manufacture with respect to gate formation and CMP processes, in accordance with embodiments herein.

FIG. 4 illustrates a stylized X-cut cross-sectional depiction of the vFET device 100 under manufacture with respect to gate formation and chemical mechanical polishing (CMP) processes, in accordance with embodiments herein. FIG. 5 illustrates a stylized Y1-cut cross-sectional depiction of the vFET device 100 under manufacture with respect to the same processes. FIG. 6 illustrates a stylized Y2-cut cross-sectional depiction of the vFET device 100 under manufacture with respect to the same processes.

The vFET device 100 depicted in FIGS. 4-6 is shown after the deposition of a gate material and a chemical-mechanical polishing (CMP) process of the gate material to the level of spacer 142, to yield a gate layer 450. The gate material may be any material known to the person of ordinary skill in the art for forming a gate of a vFET. In one embodiment, the gate material is a high-k metal gate material. CMP process parameters will be known to a person of ordinary skill in the art having benefit of the present disclosure, and need not be described.

Figure 7:
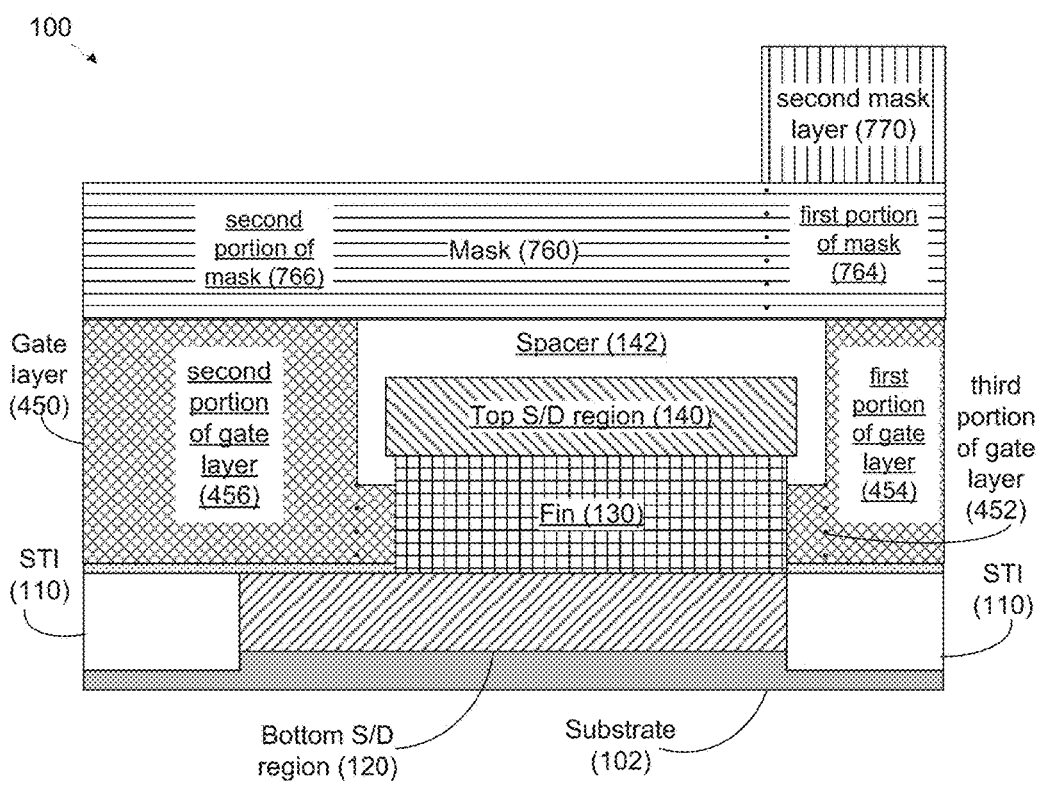
FIG. 7 illustrates a stylized X-cut cross-sectional depiction of the vFET device under manufacture with respect to mask deposition and patterning processes, in accordance with embodiments herein.
Figure 8:
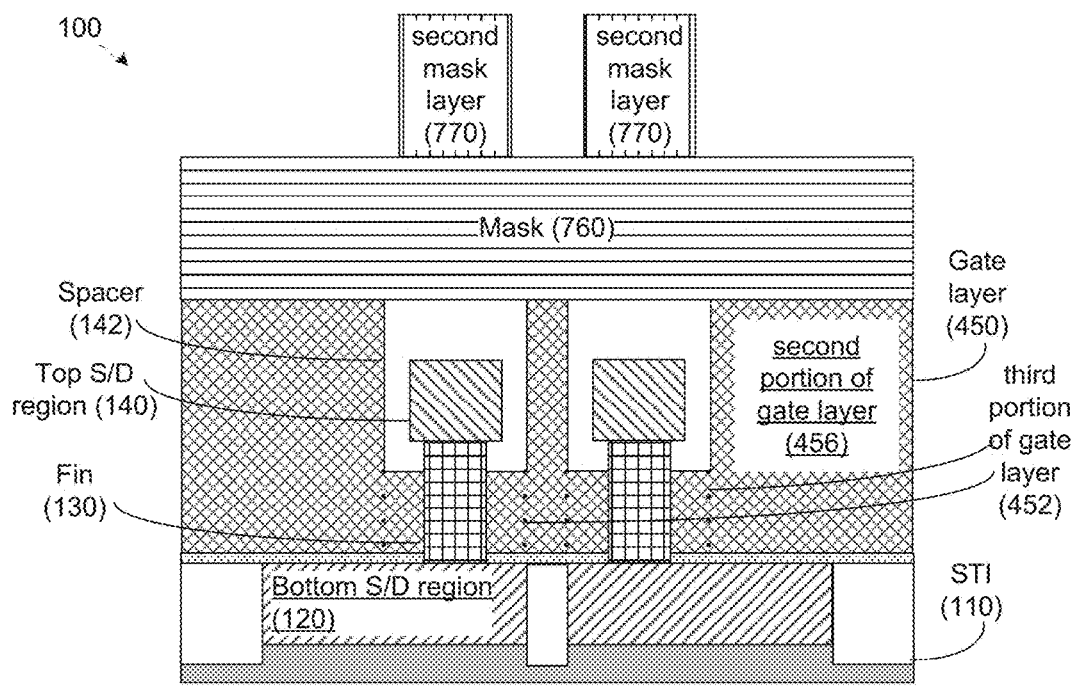
FIG. 8 illustrates a stylized Y1-cut cross-sectional depiction of the vFET device under manufacture with respect to mask deposition and patterning processes, in accordance with embodiments herein.

FIG. 7 illustrates a stylized X-cut cross-sectional depiction of the vFET device 100 under manufacture with respect to mask deposition and patterning processes, in accordance with embodiments herein. FIG. 8 illustrates a stylized Y1-cut cross-sectional depiction of the vFET device 100 under manufacture with respect to the same processes.

The vFET device 100 depicted in FIGS. 7-8 is shown after the deposition of a mask 760 and the deposition and patterning of a second mask layer 770. Mask deposition and patterning techniques will be known to a person of ordinary skill in the art having benefit of the present disclosure, and need not be described. In one embodiment, the mask 760 may include SiCO. In one embodiment, the second mask layer 770 may be an organic planarization layer (OPL).

The second mask layer 770 is deposited and patterned over the mask 760 over the gate layer 450. The portion of the mask 760 disposed under second mask layer 770 may be referred to as the first portion 764 of the mask 760. The remaining portion of the mask 760, i.e., that portion of mask 760 not disposed under second mask layer 770, may be referred to as the second portion 766 of the mask 760. As depicted in FIG. 7, the second mask layer 770 may be deposited and patterned over at least a part of the gate layer 450. A portion of the gate layer 450 disposed under the second mask layer and having a top surface above the top surface of the top S/D region 140 may be referred to as the first portion 454 of the gate layer 450. Another portion of the gate layer 450, having a top surface above the top surface of the top S/D region 140 but not disposed under the second mask layer 770, may be referred to as the second portion 456 of the gate layer 450. Another portion of the gate layer 450, disposed under the spacer 142, and/or having a top surface below the top of the top S/D region 140, may be referred to as the third portion 452 of the gate layer 450.

Figure 9:
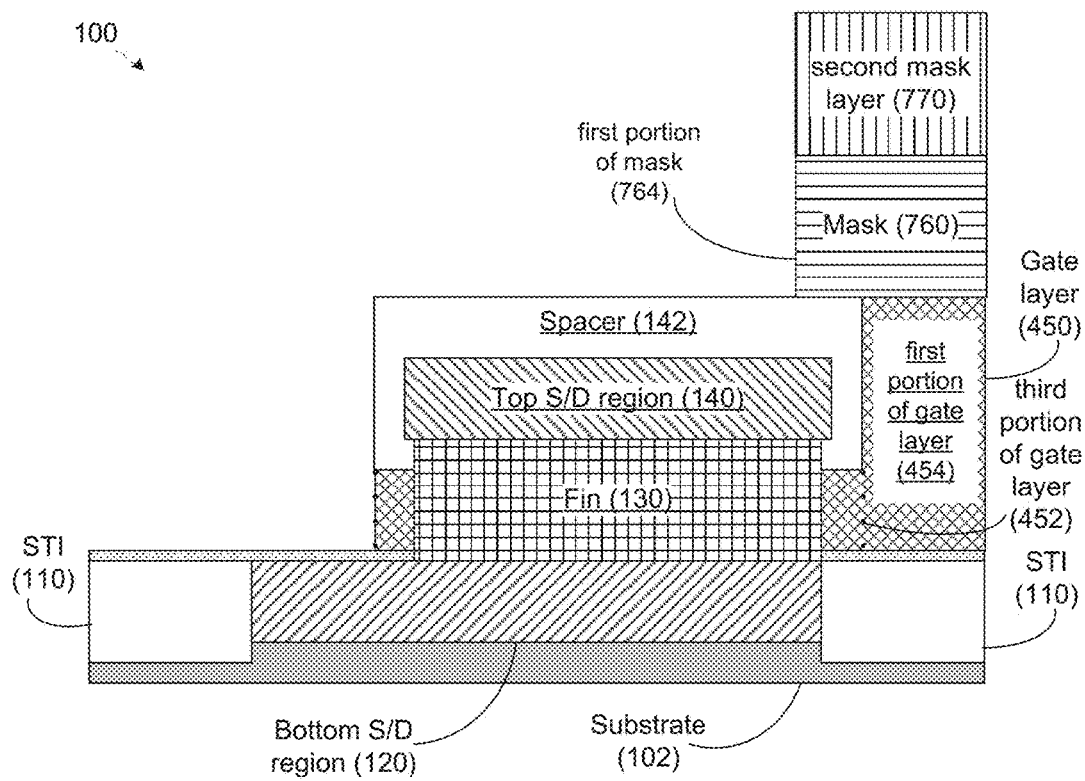
FIG. 9 illustrates a stylized X-cut cross-sectional depiction of the vFET device under manufacture with respect to mask partial removal and gate partial removal processes, in accordance with embodiments herein.
Figure 10:
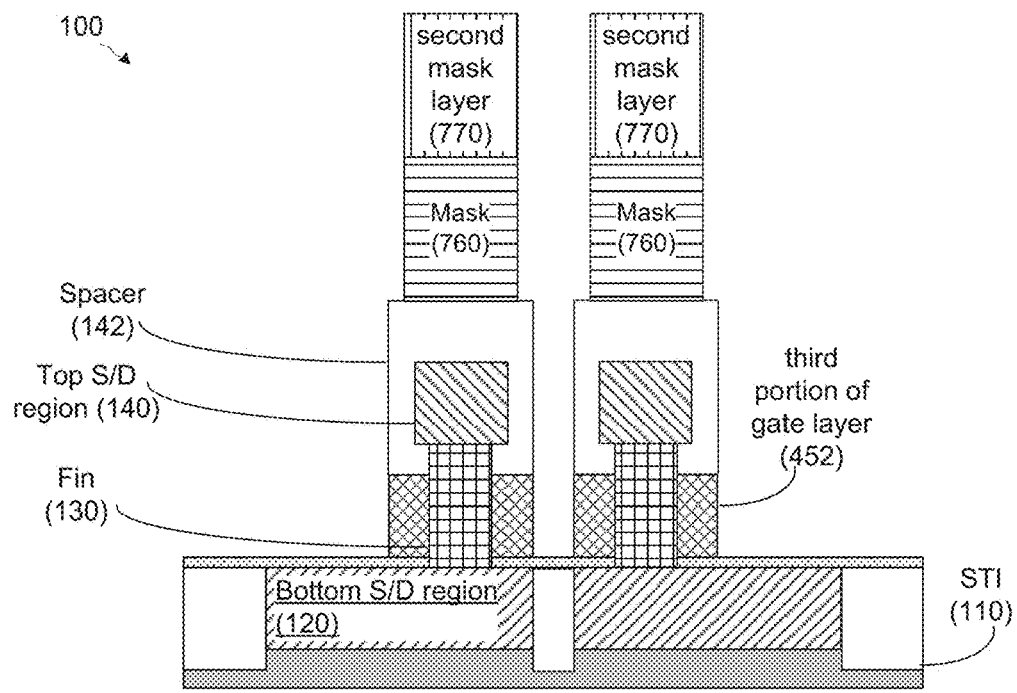
FIG. 10 illustrates a stylized Y1-cut cross-sectional depiction of the vFET device under manufacture with respect to mask partial removal and gate partial removal processes, in accordance with embodiments herein.
Figure 11:
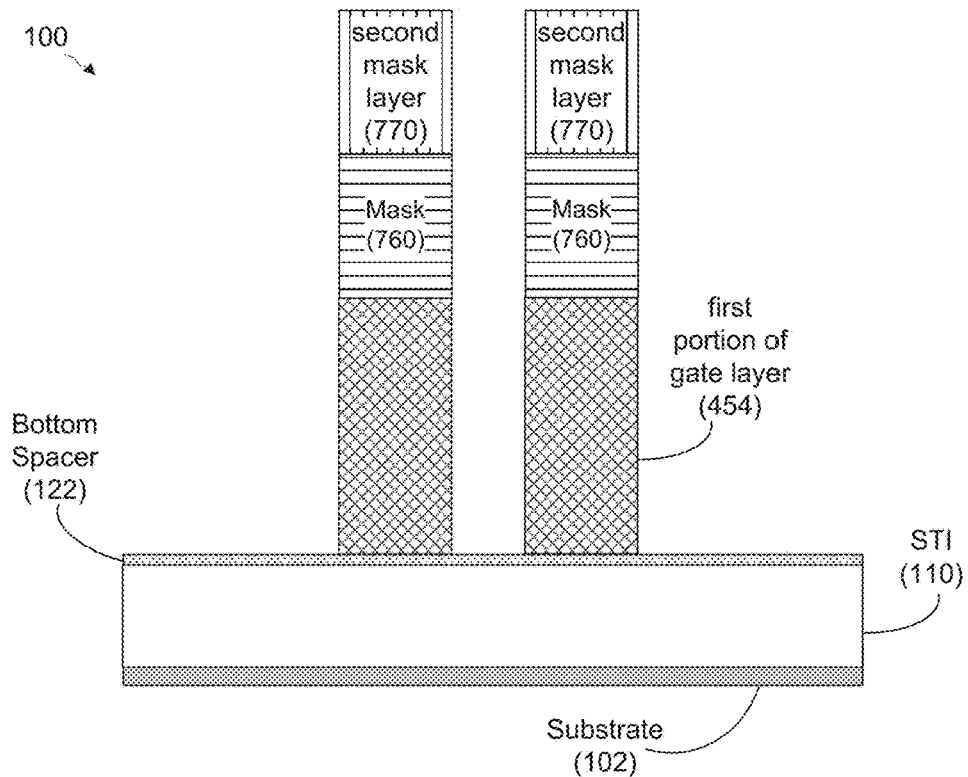
FIG. 11 illustrates a stylized Y2-cut cross-sectional depiction of the vFET device under manufacture with respect to mask partial removal and gate partial removal processes, in accordance with embodiments herein.

FIG. 9 illustrates a stylized X-cut cross-sectional depiction of the vFET device 100 under manufacture with respect to mask partial removal and gate partial removal processes, in accordance with embodiments herein. FIG. 10 illustrates a stylized Y1-cut cross-sectional depiction of the vFET device 100 under manufacture with respect to the same processes. FIG. 11 illustrates a stylized Y2-cut cross-sectional depiction of the vFET device 100 under manufacture with respect to the same processes. Techniques for partially removing a mask and partially removing a gate will be known to a person of ordinary skill in the art having benefit of the present disclosure, and need not be described in detail. Generally, in the mask partial removal process, the second mask layer 770 protects the first portion 764 of mask 760 disposed thereunder, and the second portion 766 of mask 760 (as shown in FIG. 7) not protected by the second mask layer 770 is removed (as shown in FIG. 9). Generally, in the gate partial removal process, the spacer 142 protects the third portion 452 of the gate layer 450, and the second mask layer 770 and the first portion 764 of the mask 760 protect the first portion 454 of the gate layer 450. As depicted, the second portion 456 of the gate layer 450 is removed. A gate 1250 formed from the gate layer 450 now has its final form, comprising a first portion 1254 and a second portion 1256, as depicted in subsequent figures. That said, for convenience, the terms "gate 1250" and "gate layer 450" may be used interchangeably herein. In one embodiment, the gate partial removal process may include a reactive ion etch (ME) process.

Figure 12:
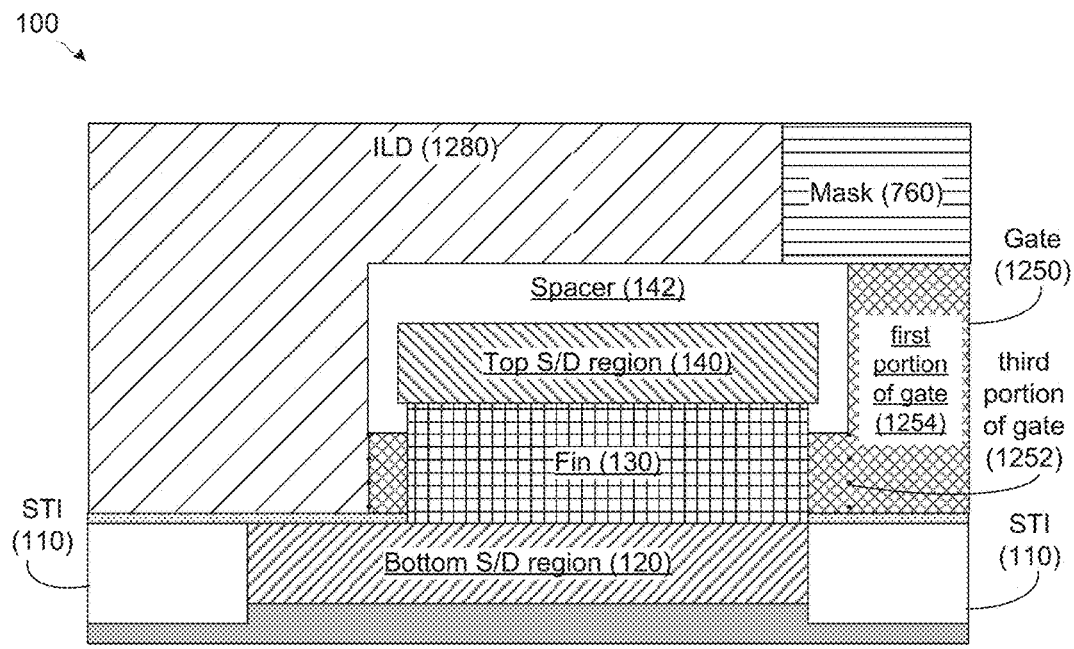
FIG. 12 illustrates a stylized X-cut cross-sectional depiction of the vFET device under manufacture with respect to interlayer dielectric (ILD) fill and CMP processes, in accordance with embodiments herein.
Figure 13:
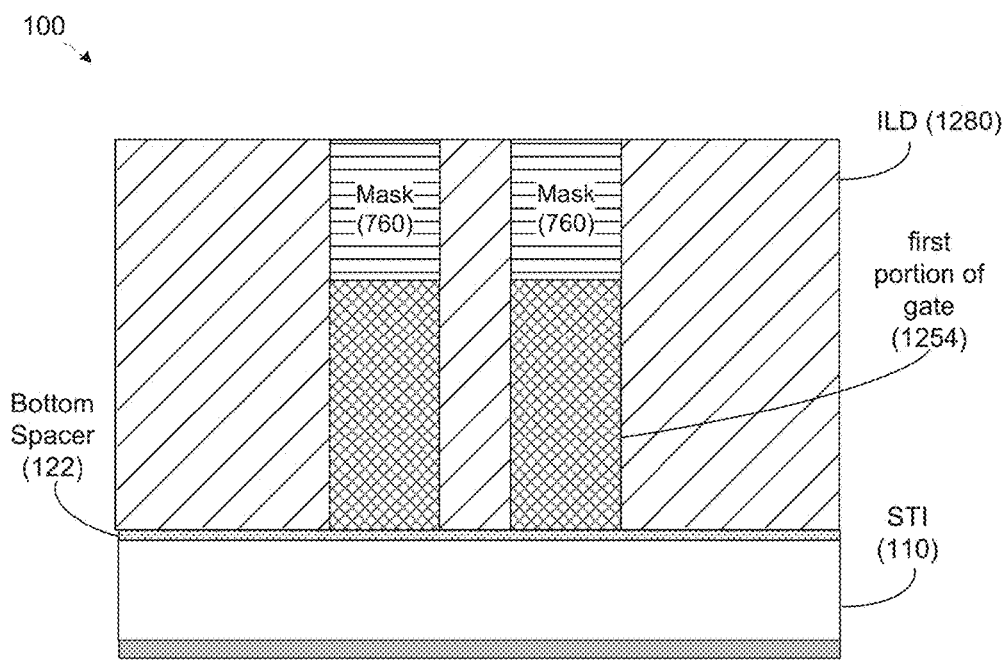
FIG. 13 illustrates a stylized Y2-cut cross-sectional depiction of the vFET device under manufacture with respect to interlayer dielectric (ILD) fill and CMP processes, in accordance with embodiments herein.

FIG. 12 illustrates a stylized X-cut cross-sectional depiction of the vFET device 100 under manufacture with respect to an interlayer dielectric (ILD) fill process and a CMP process, in accordance with embodiments herein. FIG. 13 illustrates a stylized Y2-cut cross-sectional depiction of the vFET device 100 under manufacture with respect to the same processes.

ILD fill and CMP processes known to a person of ordinary skill in the art having benefit of the present disclosure are performed. Generally, the ILD fill and CMP processes fill the space formerly occupied by the second portion 456 of the gate layer 450 and the second portion 766 of the mask 760 with ILD 1280. Generally, the CMP process removes the second mask layer 770 and planarizes the ILD 1280 to be coplanar with the mask 760.

Figure 14:
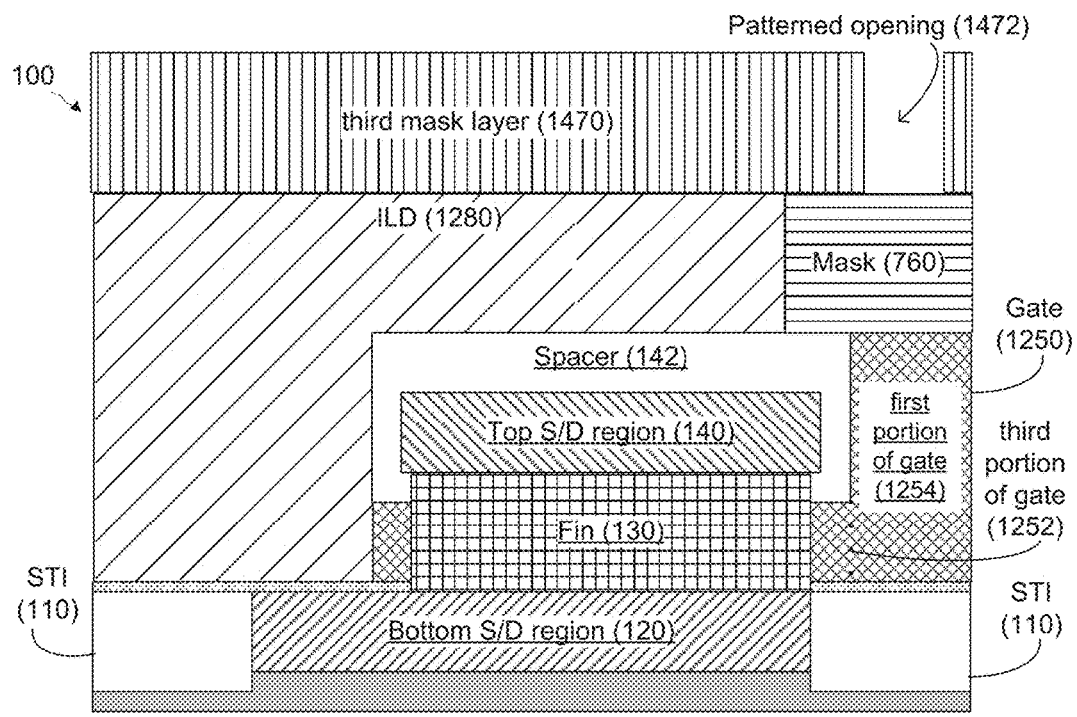
FIG. 14 illustrates a stylized X-cut cross-sectional depiction of the vFET device under manufacture with respect to a gate contact patterning process, in accordance with embodiments herein.
Figure 15:
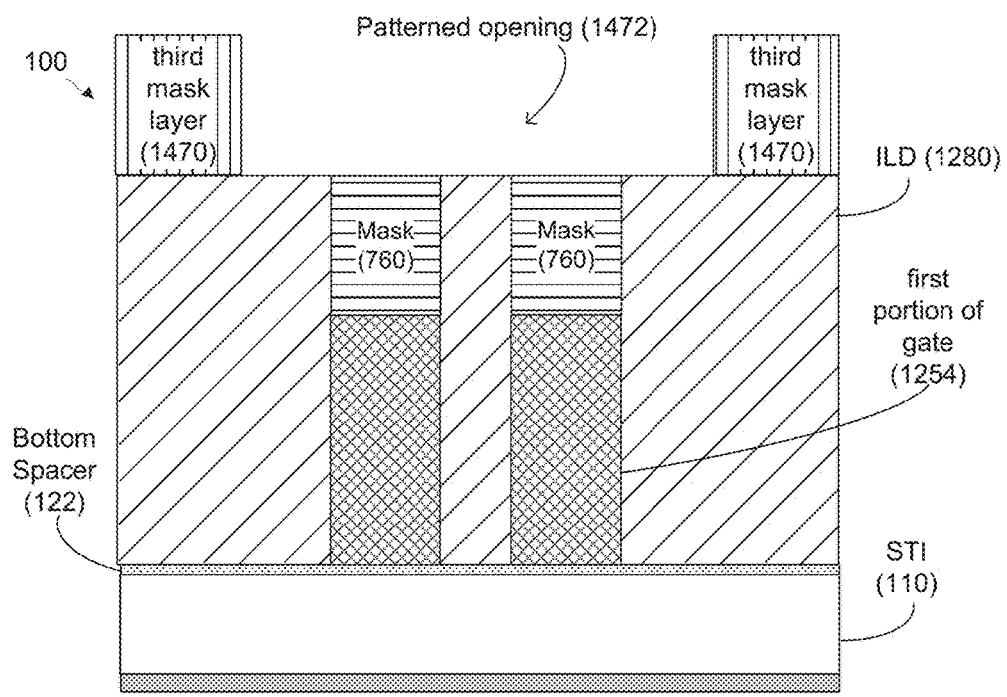
FIG. 15 illustrates a stylized Y2-cut cross-sectional depiction of the vFET device under manufacture with respect to a gate contact patterning process, in accordance with embodiments herein.

FIG. 14 illustrates a stylized X-cut cross-sectional depiction of the vFET device 100 under manufacture with respect to a gate contact patterning process, in accordance with embodiments herein. FIG. 15 illustrates a stylized Y2-cut cross-sectional depiction of the vFET device 100 under manufacture with respect to the same process. Generally, the gate contact patterning process includes depositing a third mask layer 1470 over the vFET device 100 and patterning an opening 1472 in the third mask layer 1470. Deposition and patterning techniques will be known to a person of ordinary skill in the art having benefit of the present disclosure, and need not be described.

In the vFET device 100 of FIGS. 14-15, the patterned opening 1472 is disposed over the first portion 1254 of the gate 1250. In other words, in the embodiment depicted in X-cut in FIG. 14, only a portion of the mask 760 is disposed between the bottom of the patterned opening 1472 and the top of the first portion 1254 of the gate 1250. Although it would be more desirable, as will be discussed below, for patterned opening 1472 to be formed directly over the first portion 1254 of the gate 1250, and not directly over any portion of spacer 142, even if the patterned opening 1472 were misaligned to the left or the right in the X-cut direction, so long as at least a portion of the patterned opening 1472 were formed directly over the first portion 1254 of the gate 1250, the gate contact opening process described below would still be expected to proceed with desirable results.

As depicted in FIG. 15, the patterned opening 1472 is larger in the Y2-cut direction than both remaining masks 760. Accordingly, as will be discussed below, even if the patterned opening 1472 were misaligned to the left or to the right in the Y2-cut direction, so long as the left side of patterned opening 1472 were to the left of the leftmost mask 760 and the right side of patterned opening 1472 were to the right of the rightmost mask 760, the gate contact opening process described below would still be expected to proceed with desirable results.

Figure 16:
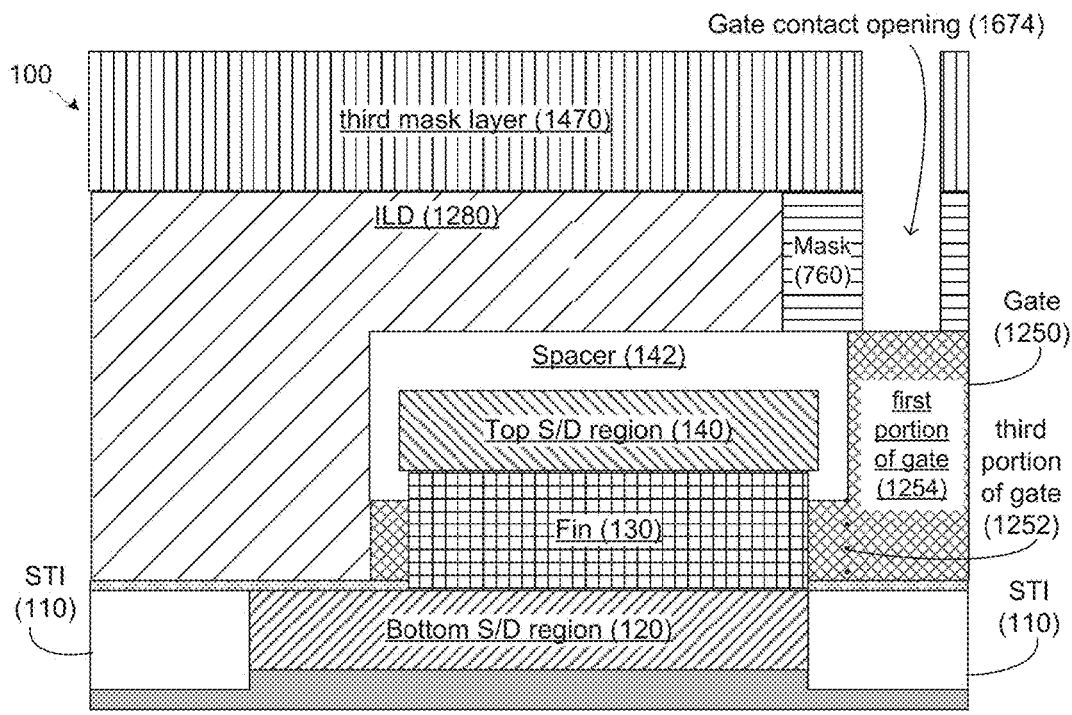
FIG. 16 illustrates a stylized X-cut cross-sectional depiction of the vFET device under manufacture with respect to a gate contact opening process, in accordance with embodiments herein.
Figure 17:
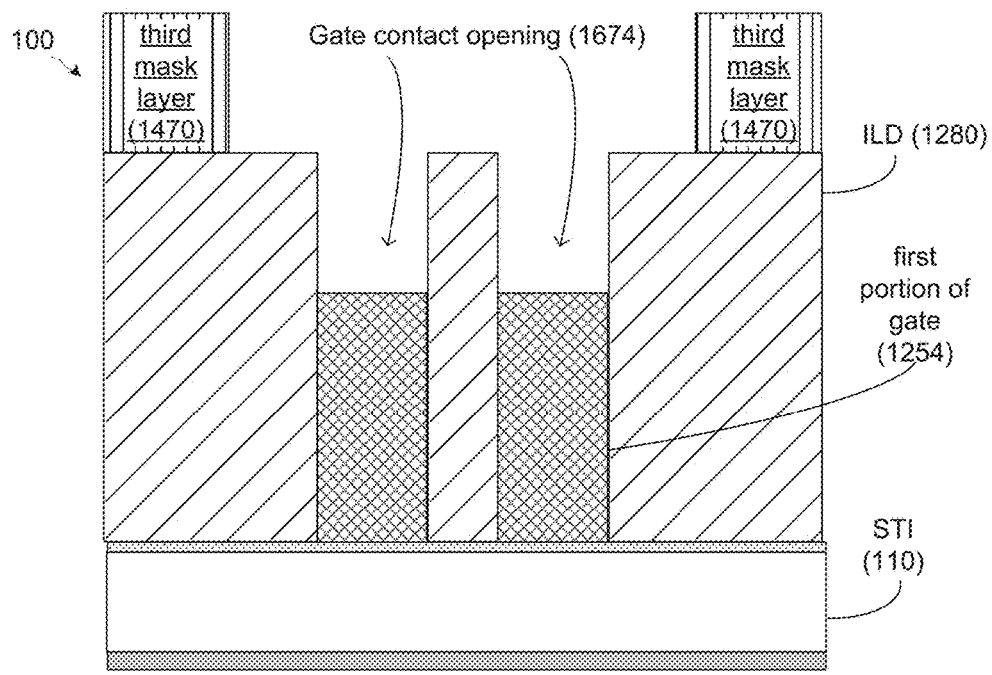
FIG. 17 illustrates a stylized Y2-cut cross-sectional depiction of the vFET device under manufacture with respect to a gate contact opening process, in accordance with embodiments herein.

FIG. 16 illustrates a stylized X-cut cross-sectional depiction of the vFET device 100 under manufacture with respect to a gate contact opening process, in accordance with embodiments herein. FIG. 17 illustrates a stylized Y2-cut cross-sectional depiction of the vFET device 100 under manufacture with respect to the same process. Based on the patterned opening 1472 of FIG. 14, a gate contact opening 1674 is formed. Generally, forming the gate contact opening 1674 includes removing portions of the mask 760 unprotected by third mask layer 1470, i.e., removing portions of the mask 760 under the patterned opening 1472. Techniques for forming gate contact openings will be known to a person of ordinary skill in the art having benefit of the present disclosure, and need not be described.

As depicted in FIG. 16, gate contact opening 1674 is formed only over gate 450. Even if the gate contact opening 1674 were misaligned slightly, the top surface of the first portion 1254 of the gate 1250 would form at least some of the bottom of the gate contact opening 1674 in X-cut view. Turning to FIG. 17, gate contact openings 1674 are formed directly over the first portion 1254 of the gate 1250. Even if the patterned opening 1472 were misaligned, the top surfaces of the first portions 1254 of the gates 1250 would form the entire bottom of the gate contact opening 1674 in Y2-cut view. The risk and/or consequences of misalignment of gate contacts are accordingly reduced. Accordingly, the gate contact opening formation 1674 can be considered as part of a self-aligned gate contact formation process.

In addition, because the top surface of the first portion 1254 of the gate 1250 is relatively high, i.e., is above the top surface of the top S/D region 140, the gate contact opening 1674 has a relatively short depth. As a result, despite the tendency of contact openings to be narrower at the bottom than at the top, the width at the top of gate contact opening 1674 is less wide than would be required for a deeper contact opening. Accordingly, the risk of electrical coupling between e.g. gate contact openings 1674 in FIG. 17 is reduced. This reduction in risk makes possible the use of a fin pitch between fins 130 of 36 nm or less while reducing the likelihood of undesirable electrical shorts.

Figure 18:
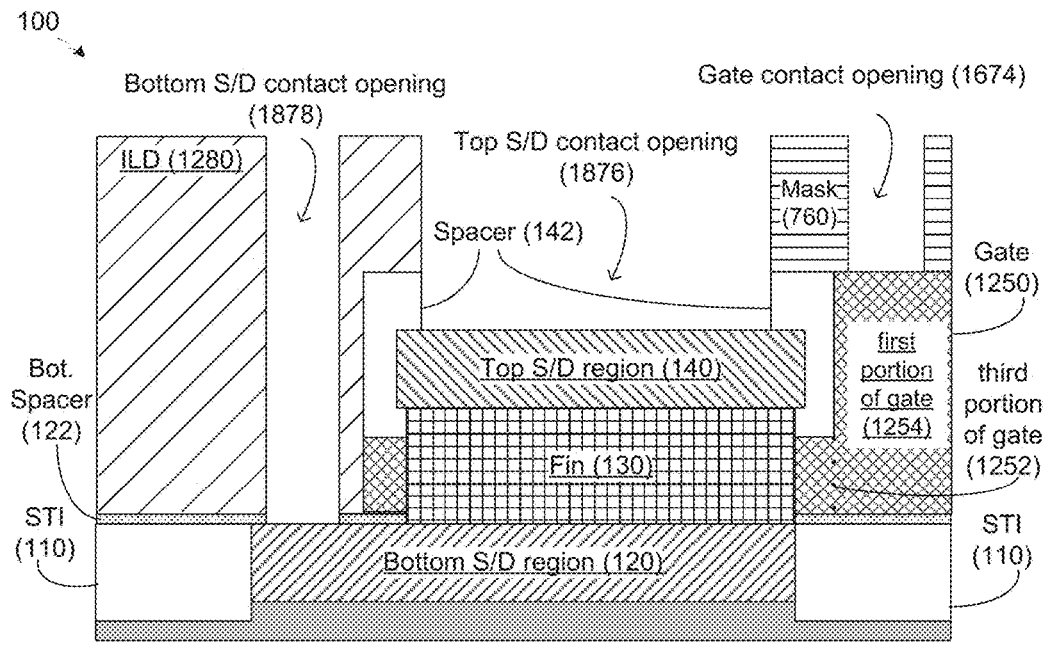
FIG. 18 illustrates a stylized X-cut cross-sectional depiction of the vFET device under manufacture with respect to top and bottom source/drain (S/D) contact opening processes, in accordance with embodiments herein.

FIG. 18 illustrates a stylized X-cut cross-sectional depiction of the vFET device 100 under manufacture with respect to top and bottom source/drain (S/D) contact opening processes, in accordance with embodiments herein. Processes for opening an ILD will be known to a person of ordinary skill in the art having benefit of the present disclosure, and need not be described. Based on those techniques, an opening in the ILD layer 1280 is formed to expose a portion of the top S/D region 140, while another opening in the ILD layer 1280 is formed to expose a portion of the bottom S/D region 120. Therefore, the vFET device 100 includes a top S/D contact opening 1876 and a bottom S/D contact opening 1878. The third mask layer 1470 may be removed using known techniques after the S/D contact openings 1876 and 1878 are formed.

Figure 19:
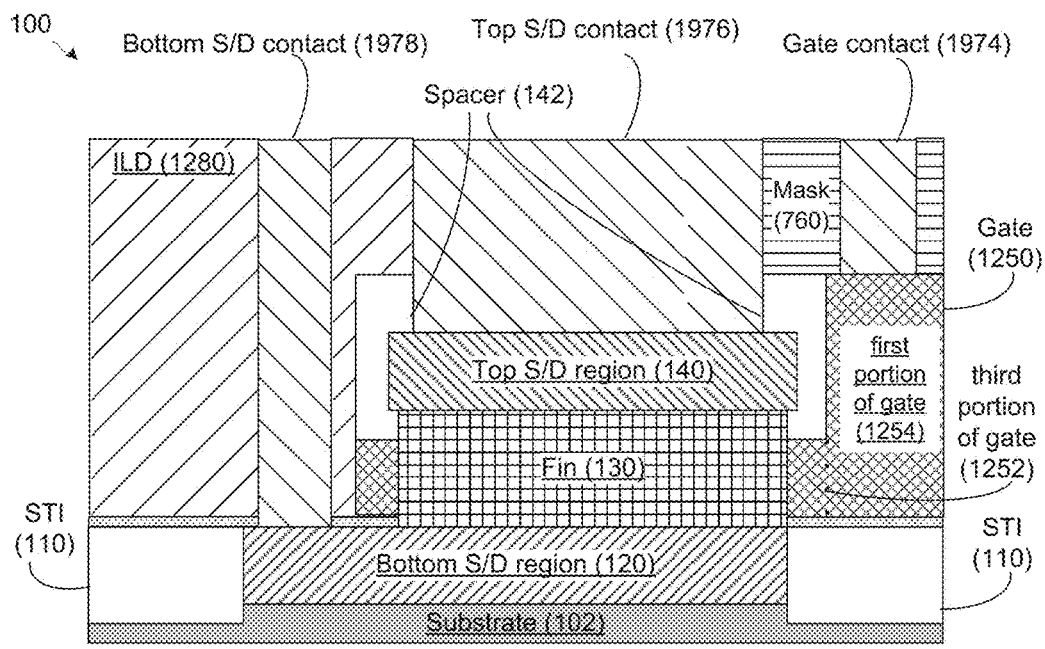
FIG. 19 illustrates a stylized X-cut cross-sectional depiction of the vFET device under manufacture with respect to gate contact, top S/D contact, and bottom S/D contact formation processes, in accordance with embodiments herein.
Figure 20:
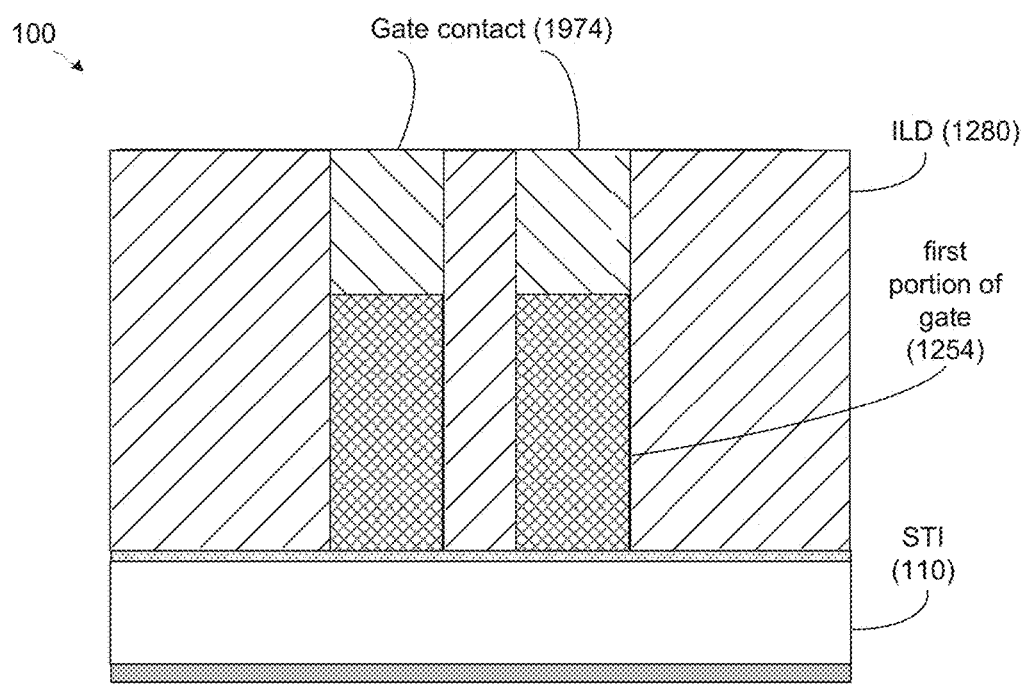
FIG. 20 illustrates a stylized Y2-cut cross-sectional depiction of the vFET device under manufacture with respect to gate contact, top S/D contact, and bottom S/D contact formation processes, in accordance with embodiments herein.

FIG. 19 illustrates a stylized X-cut cross-sectional depiction of the vFET device 100 under manufacture with respect to gate contact, top S/D contact, and bottom S/D contact formation processes, in accordance with embodiments herein. FIG. 20 illustrates a stylized Y2-cut cross-sectional depiction of the vFET device under manufacture with respect to the same contact formation processes. A gate contact 1974 is formed in gate contact opening 1674 of FIG. 19. Further, a top S/D contact 1976 is formed in the top S/D contact opening 1876 of FIG. 19, and a bottom S/D contact 1978 is formed in the bottom S/D contact 1978 of FIG. 19. Generally, the gate contact 1974, the top S/D contact 1976, and the bottom S/D contact 1978 may be formed using techniques that will be known to a person of ordinary skill in the art having benefit of the present disclosure, and need not be described. The gate contact 1974, top S/D contact 1976, and bottom S/D contact 1978 may include the same conductive material or any two or three thereof may include different conductive materials. The Y2-cut view of FIG. 20 shows the gate contact 1974 over the first portions 1254 of the gate 1250.

The process exemplified herein may be used to manufacture a semiconductor device 100. As depicted in FIGS. 19-20, the semiconductor device 100 may include a semiconductor substrate 102; a first vertical field effect transistor (vFET), including a bottom source/drain (S/D) region 120 disposed on the semiconductor substrate 102; a fin 130 disposed above the bottom S/D region 120; a top source/drain (S/D) region 140 disposed above the fin 130 and having a top surface; and a gate 1250 including a third portion 1252 laterally surrounding the fin 130 and a first portion 1254 having a top surface higher than the top surface of the top S/D region 140. The semiconductor device 100 may further include a first contact, e.g., bottom S/D contact 1978 disposed on the bottom S/D region 120; a second contact, e.g., top S/D contact 1976 disposed on the top S/D region 140; and a third contact, e.g., gate contact 1974, disposed on the first portion 1254 of the gate 1250. The semiconductor device 100 may also include an interlayer dielectric (ILD) 1280 laterally surrounding the first contact 1978, adjoining the second contact 1976, and adjoining the third contact 1974; and a mask 760 disposed between and adjoining the second contact 1976 and the third contact 1974. In one embodiment, the mask 760 may include SiCO. In one embodiment, the third contact 1974 is aligned with the first portion 1254 of the gate 1250 (i.e., the bottom surface of the third contact 1974 adjoins only the top surface of the first portion 1254 of the gate 1250, and adjoins no other layer or structure).

The semiconductor device 100 may further include a spacer 142 surrounding and disposed above the top S/D region 140. ("Surrounding" here excludes the fin 130 and the second contact 1976, which each also contact at least part of at least one surface of the top S/D region 140).

The semiconductor device 100 may yet additionally include a second vFET having the same structures as the first vFET, wherein the first vFET has a long axis parallel to a long axis of the second vFET. A fin pitch between the first vFET and the second vFET may be 36 nm or less.

Figure 21:
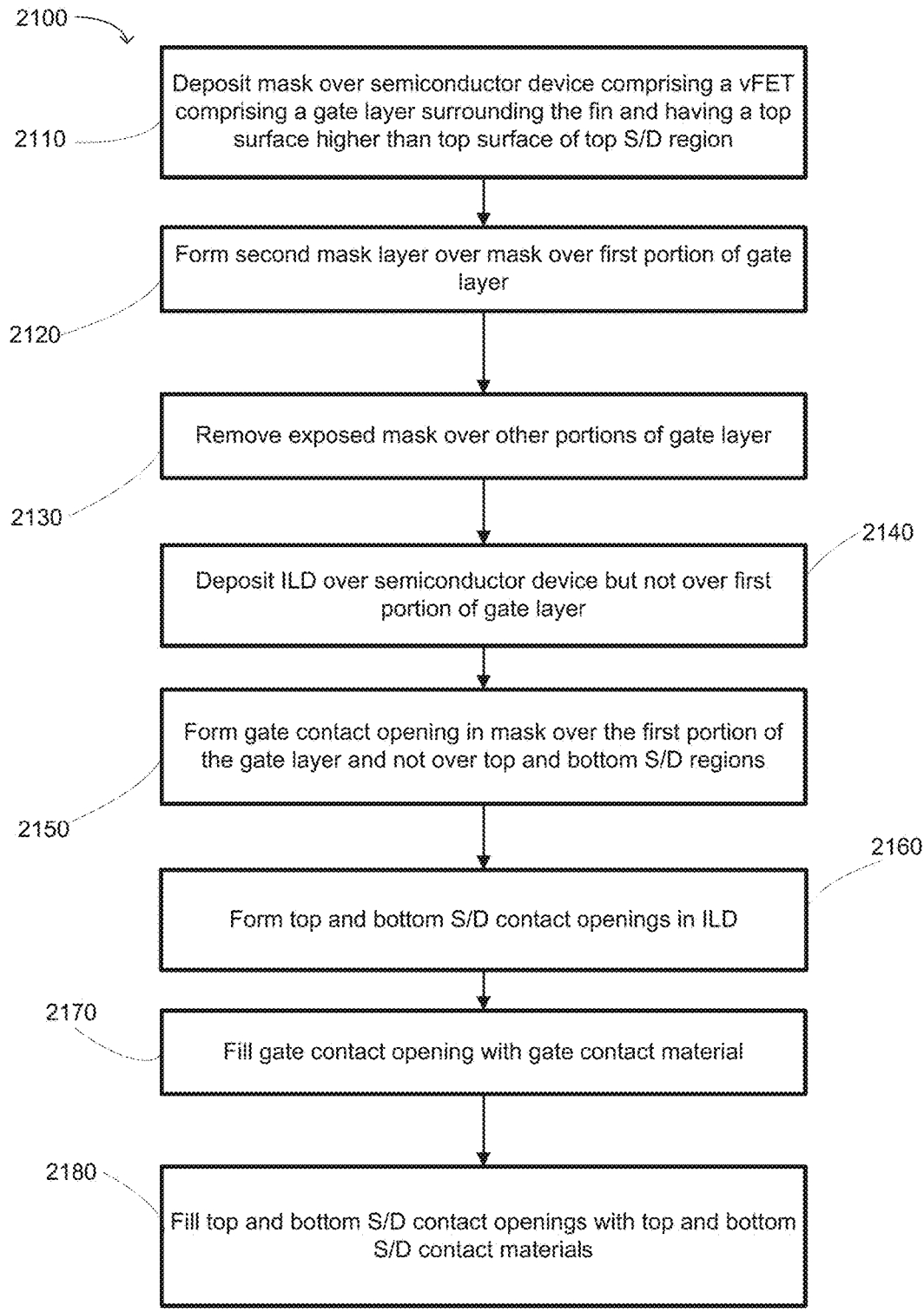
FIG. 21 illustrates a flowchart depiction of process steps of providing a vFET device, in accordance with embodiments herein.

Turning now to FIG. 21, a flowchart depiction of process steps of providing a vFET device in accordance with embodiments herein is illustrated. The process 2100 may include depositing (at 2110) a mask over a semiconductor device including a semiconductor substrate; a first vertical field effect transistor (vFET) including a bottom source/drain (S/D) region disposed on the semiconductor substrate; a fin disposed above the bottom S/D region; a top source/drain (S/D) region disposed above the fin and having a top surface; and a gate laterally surrounding the fin and including a first portion having a top surface higher than the top surface of the top S/D region; wherein the mask is deposited over the first portion of the gate. The gate may also include a second portion also having a top surface higher than the top surface of the top S/D region and over which the mask may be deposited, but which will processed differently than the first portion in later steps. In one embodiment, the vFET further includes a spacer surrounding and over the top S/D region and over a third portion of the gate.

In one embodiment, the gate includes a high-k metal gate material. In one embodiment, depositing the mask further includes depositing the mask over the third portion and the second portion of the gate. In one embodiment, the mask may include SiCO.

In one embodiment, the process 2100 may also include forming (at 2120) a second mask layer, such as an organic planarization layer (OPL), over the mask over the first portion of the gate; and removing (at 2130) an exposed portion of the mask over the second portion of the gate and over the spacer, followed by removing the second portion of the gate, to yield a space from which the exposed portion of the mask and the second portion of the gate have been removed.

In one embodiment, the process 2100 may further include depositing (at 2140) an interlayer dielectric (ILD) over the semiconductor device, wherein the ILD is not deposited over the first portion of the gate. For example, the ILD may be deposited in the space from which the exposed portion of the mask and the second portion of the gate have been removed. Subsequent to ILD deposition, the ILD may be planarized to be coplanar with the mask.

The process 2100 also includes forming (at 2150) a gate contact opening in the mask, wherein the gate contact opening is formed over the first portion of the gate and is not formed over the top S/D region and the bottom S/D region. Forming a gate contact opening may be performed using patterning techniques known in the art.

In one embodiment, the process 2100 may also include forming (at 2160) a top S/D contact opening in the ILD over the top S/D region and a bottom S/D contact opening in the ILD over the bottom S/D region.

The process 2100 includes filling (at 2170) the gate contact opening with a gate contact material. In one embodiment, the gate contact opening is aligned with the first portion of the gate. In one embodiment, the process 2100 may also include filling (at 2180) the top S/D contact opening with a top S/D contact material and the bottom S/D contact opening with a bottom S/D contact material.

The process 2100 may be performed on a plurality of fins at the same time. Accordingly, in one embodiment, the semiconductor device further includes a second vFET including a bottom source/drain (S/D) region disposed on the semiconductor substrate; a fin disposed above the bottom S/D region; a top source/drain (S/D) region disposed above the fin and having a top surface; and a gate including a first portion having a top surface higher than the top surface of the top S/D region; wherein the first vFET has a long axis parallel to a long axis of the second vFET; and the method further includes filling a gate contact opening over the first portion of the gate of the second vFET.

In one embodiment, a fin pitch between the first vFET and the second vFET is 36 nm or less. In one embodiment, the first vFET and the second vFET may share a top S/D contact. In embodiments wherein the semiconductor device further includes a third vFET, a fourth vFET, etc., three or more vFETs may share a top S/D contact.

Figure 22:
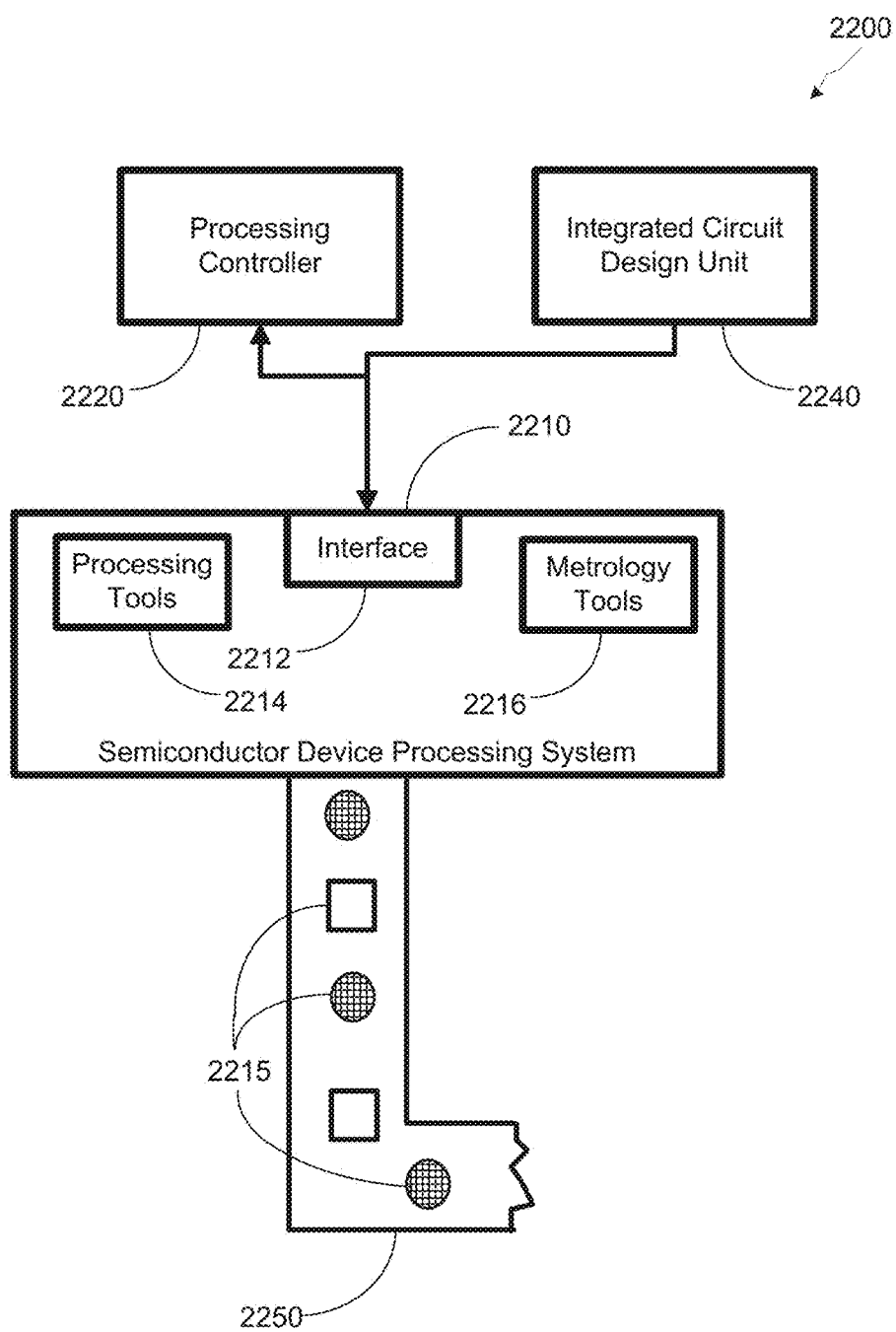
FIG. 22 illustrates a stylized depiction of a system for fabricating a semiconductor device package including a vFET device, in accordance with embodiments herein.

Turning now to FIG. 22, a stylized depiction of a system 2200 for fabricating a semiconductor device package including a vFET, in accordance with embodiments herein, is illustrated. A system 2200 of FIG. 22 may include a semiconductor device processing system 2210 and a design unit 2240. The semiconductor device processing system 2210 may manufacture integrated circuit devices based upon one or more designs provided by the design unit 2240. The system 2200 is capable of performing at least one of the process steps described in FIGS. 2-20. The semiconductor device processing system 2210 is capable of implementing the process described in the flowchart of FIG. 21.

The semiconductor device processing system 2210 may include various processing stations, such as etch process stations, photolithography process stations, CMP process stations, etc. Each of the processing stations may include one or more processing tools 2214 and or metrology tools 2216. Feedback based on data from the metrology tools 2216 may be used to modify one or more process parameters used by the processing tools 2214 for performing process steps.

The semiconductor device processing system 2210 may also include an interface 2212 that is capable of providing communications between the processing tools 2214, the metrology tools 2216, and a controller, such as the processing controller 2220. One or more of the processing steps performed by the semiconductor device processing system 2210 may be controlled by the processing controller 2220. The processing controller 2220 may be a workstation computer, a desktop computer, a laptop computer, a tablet computer, or any other type of computing device including one or more software products that are capable of controlling processes, receiving process feedback, receiving test results data, performing learning cycle adjustments, performing process adjustments, etc.

The semiconductor device processing system 2210 may produce integrated circuits (e.g., vFET devices) on a medium, such as silicon wafers. In one embodiment, the semiconductor device processing system 2210 may produce integrated circuits having vFET devices 100 wherein a top surface of a first portion 1254 of a gate 1250 are higher than a top surface of a top S/D region 140; and or vFET devices 100 including self-aligned gate contacts.

The production of integrated circuits by the semiconductor device processing system 2210 may be based upon the circuit designs provided by the integrated circuits design unit 2240. The semiconductor device processing system 2210 may provide processed integrated circuits/devices 2215 on a transport mechanism 2250, such as a conveyor system. In some embodiments, the conveyor system may be sophisticated clean room transport systems that are capable of transporting semiconductor wafers. In one embodiment, the semiconductor device processing system 2210 may include a plurality of processing steps, e.g., the 1$^{st}$ process step, the 2$^{nd}$ process step, etc., as described above.

In some embodiments, the items labeled "2215" may represent individual wafers, and in other embodiments, the items 2215 may represent a group of semiconductor wafers, e.g., a "lot" of semiconductor wafers. The integrated circuit or device 2215 may be a transistor, a capacitor, a resistor, a memory cell, a processor, and/or the like. In one embodiment, the device 2215 is a transistor and the dielectric layer is a gate insulation layer for the transistor.

The integrated circuit design unit 2240 of the system 2200 is capable of providing a circuit design that may be manufactured by the semiconductor device processing system 2210. This may include information regarding the components of the semiconductor device 100 described above. For example, this information may include the relative heights of the top surface of the top S/D region 140 and the top surface of the first portion 1254 of the gate 1250. For another example, this information may include the positioning of gate contacts 1974.

The integrated circuit design unit 2240 may be capable of determining the number of devices (e.g., processors, memory devices, etc.) to place in a device package. The integrated circuit design unit 2240 may also determine the height of the fins, the dimensions of the S/D regions, the dimensions of the gates, the height of the second portions of the gates, etc. These dimensions may be based upon data relating to drive currents/performance metrics, device dimensions, etc. Based upon such details of the devices, the integrated circuit design unit 2240 may determine specifications of the vFETs that are to be manufactured. Based upon these specifications, the integrated circuit design unit 2240 may provide data for manufacturing a semiconductor device package described herein. Although, the process steps set forth above are generally described in the context of vFETs, those skilled in the art would appreciate that the process steps may also be performed on standard FET devices.

The system 2200 may be capable of performing analysis and manufacturing of various products involving various technologies. For example, the system 2200 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2200 to fabricate the devices 300 described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a first vertical field effect transistor (vFET), comprising:

forming a bottom source/drain (S/D) region disposed on a semiconductor substrate;

forming a fin disposed above said bottom S/D region;

forming a top source/drain (S/D) region disposed above said fin and having a top surface;

forming a gate layer laterally surrounding said fin;

patterning a mask over a first portion of said gate layer, wherein said first portion of said gate layer has a top surface above the top surface of the top S/D region;

surrounding at least partially said first portion of said gate layer and said mask on top thereof with an interlayer dielectric (ILD) layer;

removing at least a portion of said mask, thereby forming a gate contact opening directly over said first portion of said gate layer; and filling said gate contact opening with a gate contact material.

2. The method of claim 1, further comprising:
forming a spacer surrounding and over said top S/D region before forming said gate layer, said spacer being over a third portion of said gate layer adjacent to said fin, wherein said mask is deposited partially over said spacer.

3. The method of claim 2, wherein surrounding at least partially said first portion of said gate layer and said mask on top thereof with said ILD layer comprises removing a second portion of said gate layer not covered by said mask and not covered by the spacer, to yield a space; and depositing said ILD layer in said space.

4. The method of claim 2, further comprising forming a second vFET comprising a bottom source/drain (S/D) region disposed on a semiconductor substrate; a fin disposed above said bottom S/D region; a top source/drain (S/D) region disposed above said fin and having a top surface; a gate layer having a top surface higher than said top surface of said top S/D region; and a gate contact opening filled with a gate contact material over said gate; wherein said first vFET has a long axis parallel to a long axis of said second vFET.

5. The method of claim 4, wherein a fin pitch between said first vFET and said second vFET is 36 nm or less.

6. The method of claim 1, further comprising:
forming a top S/D contact opening in said ILD over said top S/D region;
forming a bottom S/D contact opening in said ILD over said bottom S/D region;
filling said top S/D contact opening with a top S/D contact material; and
filling said bottom S/D contact opening with a bottom S/D contact material.

7. The method of claim 1, wherein said gate contact opening is aligned with said first portion of said gate layer.

8. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
form a bottom source/drain (S/D) region disposed on a semiconductor substrate;
form a fin disposed above said bottom S/D region;
form a top source/drain (S/D) region disposed above said fin and having a top surface;
form a gate layer laterally surrounding said fin;
pattern a mask over a first portion of said gate layer, wherein said first portion of said gate layer has a top surface above the top surface of the top S/D region;
surround at least partially said first portion of said gate layer and said mask on top thereof with an interlayer dielectric (ILD) layer;
remove at least a portion of said mask, thereby forming a gate contact opening directly over said first portion of said gate layer; and
fill said gate contact opening with a gate contact material.

9. The system of claim 8, wherein said semiconductor device processing system is further adapted to:
form a spacer surrounding and over said top S/D region before forming said gate layer, said spacer being over a third portion of said gate layer adjacent to said fin, wherein said mask is deposited partially over said spacer.

10. The system of claim 9, wherein said semiconductor device processing system is further adapted to:
form a top S/D contact opening in said ILD over said top S/D region;
form a bottom S/D contact opening in said ILD over said bottom S/D region;
fill said top S/D contact opening with a top S/D contact material; and
fill said bottom S/D contact opening with a bottom S/D contact material.

\* \* \* \* \*